(12) United States Patent
Ha

(10) Patent No.: US 6,590,810 B2
(45) Date of Patent: Jul. 8, 2003

(54) SOURCE BIASING CIRCUIT FOR FLASH EEPROM

(75) Inventor: Chang Wan Ha, Pleasanton, CA (US)

(73) Assignee: Winbond Electronics Corporation, San Jose, CA (US)

( * ) Notice: Subject to any disclaimer, the term of this patent is extended or adjusted under 35 U.S.C. 154(b) by 0 days.

(21) Appl. No.: 09/930,768

(22) Filed: Aug. 15, 2001

(65) Prior Publication Data

US 2003/0035321 A1 Feb. 20, 2003

(51) Int. Cl.[7] .............................................. G11C 16/04
(52) U.S. Cl. ............................ 365/185.18; 365/185.05
(58) Field of Search ....................... 365/185.18, 185.05, 365/185.14, 185.23, 185.28

(56) References Cited

U.S. PATENT DOCUMENTS

| | | | | |
|---|---|---|---|---|
| 5,659,504 A | * | 8/1997 | Bude et al. | 365/185.12 |
| 5,910,918 A | * | 6/1999 | Hirano | 365/185.16 |
| 6,229,734 B1 | * | 5/2001 | Watanabe | 365/185.18 |
| 6,256,228 B1 | * | 7/2001 | Hirano | 365/185.11 |

* cited by examiner

Primary Examiner—Michael S. Lebentritt
Assistant Examiner—Anh Phung
(74) Attorney, Agent, or Firm—Townsend and Townsend and Crew LLP

(57) ABSTRACT

A source biasing circuit for providing a negative biasing voltage to an electrically-erasable, programmable read-only memory (EEPROM) circuit during a read or programming operation. The negative biasing voltage helps overcome the source line resistance that would otherwise require a larger number of metal lines. The smaller number of metal lines required when using the source biasing circuit allows the EEPROM to be made smaller.

16 Claims, 2 Drawing Sheets

SOURCE BIASING CIRCUIT FOR FLASH EEPROM

The present invention relates to flash electricall-erasable, programmable read-only memories (EEPROMs). In particular, the present invention relates to source biasing circuits for flash EEPROMs.

BACKGROUND OF THE INVENTION

FIG. 1 shows a conventional EEPROM 20. The EEPROM 20 includes a number of cell transistors 22, a number of bit lines 24 running vertically, a number of word lines 26 running horizontally, a number of source lines 28 running horizontally, and a source bias generator circuit 30. The cell transistors 22 store the information in the EEPROM 20. Information may be written to or read from the cell transistors via the bit lines 24, word lines source lines 28 and associated read/write circuitry (not shown).

During a read or programming operation, the source bias generator 30 receives a control signal 32 indicating that the source bias generator 30 should couple the source lines 28 to ground. (During other operations the source bias generator 30 may couple the source lines 28 to a positive voltage $V_{source}$). The source lines 28 are coupled by an N+ active diffusion layer.

In order to reduce source line resistance, a number of metal lines 34 running vertically couple the source lines 28. The source line resistance is manageable when the number of bit lines 24 (or cell transistors 22) between every metal line 34 is limited to sixteen or fewer, as further detailed below.

The source line resistance $R_{SL}$ may be calculated as follows. The N+ resistance for a narrow N+ active width is approximately 100 ohms per square (Ω/s). (Ohms per square means the resistance when length is equal to width.) Each cell transistor 22 has an X size (width) of approximately 1.0 μm. The width of each source line is approximately 0.5 μm. With 16 cell transistors 22 separating each metal line 34, the worst case source line resistance will be for the center cell transistor 22, as follows:

$$R_{SL}=16*100\Omega/s*1.0 \mu m /0.5 \mu m /4=800\Omega$$

where the final division factor of 4 is due to having a metal line on each side.

During the programming operation, for a cell transistor 22 its gate is charged to approximately 9 V (via its word line 26), its drain is charged to approximately 5 V (via its bit line 24), and its source is coupled to ground (via source bias generator 30). However, the actual voltage present at the source of the cell transistor 22 will be nonzero due to the source line resistance. Generally, the $I_{ds}$ current in the stack gate using channel hot electron injection is approximately between 300 and 600 μA, depending upon cell size and process conditions. If you assume a median value of 500 μA, then the worst-case cell source voltage is as follows:

$$V_s = 800 \, \Omega * 500 \, \mu A$$
$$= 0.4 \, V$$

This nonzero source voltage affects programming efficiency. In addition, the Actual source voltage of a cell transistor 22 will depend upon its distance from the closest metal line 34, which causes programming inconsistency. For this reason, it is generally necessary to have one metal line 34 between every 16 or fewer cell transistors 22. This is a constraining factor when attempting to reduce the cell array size of the EEPROM 20.

Similarly, during the read operation, the $I_{ds}$ current for one cell is approximately between 50 and 150 μA. If you assume a median value of 100 μA, then the worst-case cell source voltage is as follows:

$$V_s = 800 \, \Omega * 100 \, \mu A$$
$$= 0.08 \, V$$

This 0.08 volts can also affect the bit line sensing voltage when the bit line voltage is approximately 1.0 volts. For these reasons, it is generally necessary to have one metal line 34 between every 16 or fewer cell transistors 22, which is a further constraining factor when attempting to reduce the cell array size of the EEPROM 20.

There is a need to reduce the cell array size of the EEPROM while maintaining a low source voltage during a read or programming operation on the EEPROM.

BRIEF SUMMARY OF THE INVENTION

According to one embodiment, a source biasing circuit for an EEPROM includes a first set of two transistors, a second set of two transistors, and a third set of two transistors. The first set is coupled between an upper node supplying a source voltage and a lower node supplying a negative biasing voltage. The second set is coupled between the upper node and the lower node, and the second set is cross-couple to the first set. The third set is also coupled between the upper node and the lower node, and the third set is controlled by the second set to selectively couple one of the source voltage and the negative biasing voltage to a source connection of the EEPROM.

According to another embodiment, an EEPROM includes a number of bit lines, a number of word lines, a source connection, a number of cell transistors, and a source biasing circuit. The source biasing circuit is coupled to selectively provide a negative biasing voltage to the source connection.

According to yet another embodiment, a method of improving read or programming performance of an EEPROM includes the act of selectively providing a negative biasing voltage to a source connection of the EEPROM. The method further includes the act of.

One benefit of the present invention is that it reduces the number of required metal lines while maintaining an acceptable source voltage. In this manner, the cell array size of the EEPROM may be reduced.

DETAILED DESCRIPTION OF THE INVENTION

Figure 1:
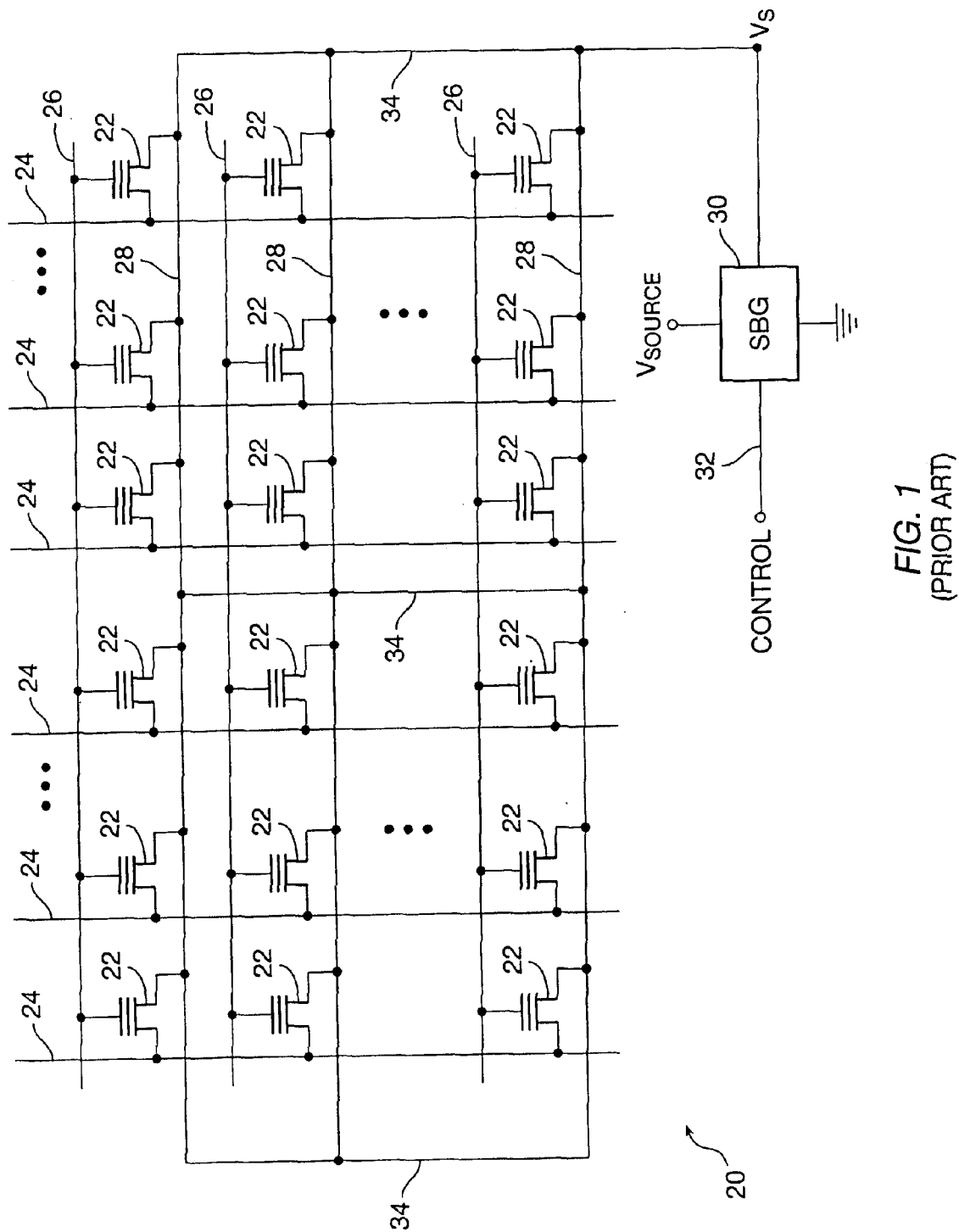
FIG. 1 is a circuit diagram of a conventional EEPROM.
Figure 2:
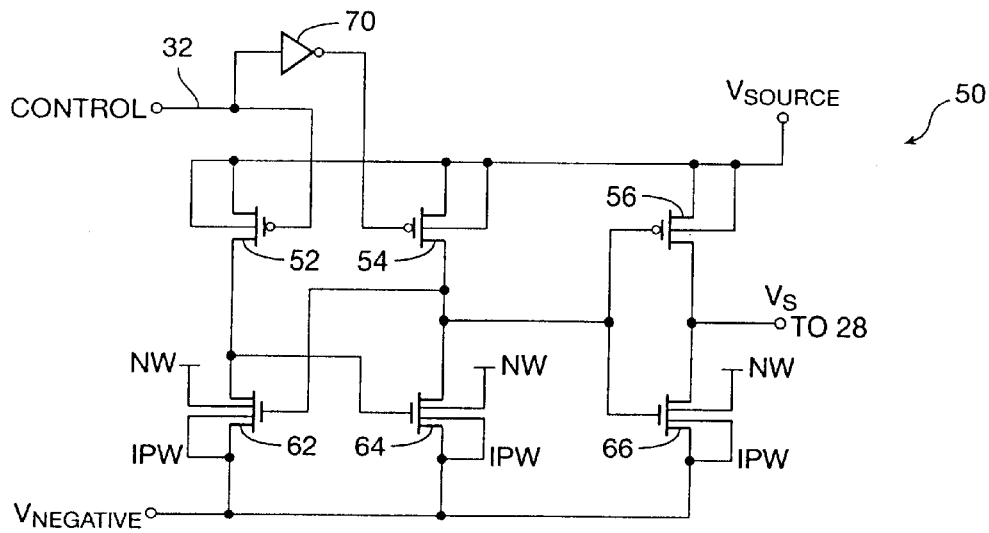
FIG. 2 is a circuit diagram of a source biasing circuit according to the present invention.

FIG. 2 is a block diagram of a source biasing circuit 50 that may be substituted for the source biasing generator 30 in FIG. 1. The source biasing circuit 50 includes three PMOS transistors 52, 54 and 56; three NMOS transistors 62, 64 and 66; and an inverter 70. The PMOS transistors 52, 54 and 56 have their N-wells coupled to $V_{source}$. The NMOS transistors 62, 64 and 66 have their N-wells coupled to $V_{DD}$ and their isolated P-wells coupled to $V_{negative}$.

As can be seen from FIG. 2, the control signal 32 causes the source biasing circuit 50 to selectively couple its output $V_s$ to either $V_{source}$ or $V_{negative}$. Specifically, during a read or programming operation, $V_s$ should be coupled to $V_{negative}$. The potential of $V_{negative}$ should be sufficient to offset the source voltage seen at the sources of the cell transistors 22 (e.g., 0.4 volts as detailed above). Ideally, $V_{negative}$ should be between zero and −0.5 volts. Generally, $V_{negative}$ should not be more negative than the N+ junction/P-substrate (or P-well) built-in potential, which generally ranges between −0.6 and −0.7 volts. Even though the voltage of $V_{negative}$ may cause a leakage path in the cell transistors 22 due to P-substrate or P-well noise from the P-substrate to $V_s$ node, there is no problem because the node voltage will not be higher than in the conventional case of FIG. 1.

By applying a negative biasing voltage, the source biasing circuit 50 allows there to be more bit lines 24 (or cell transistors 22) between each metal line 34 without having to worry about the source resistance. For a given number of bit lines 24, then, the source biasing circuit 50 allows a reduction in the number of required metal lines 34 as compared to the conventional case of FIG. 1. For example, the number of cell transistors 22 between each metal line 34 may be increased to 24, 32, 40, 48, 56, 64 or other numbers greater than 16. The reduced number of required metal lines allows the cell array size of the EEPROM 20 to be reduced.

Figure 3:
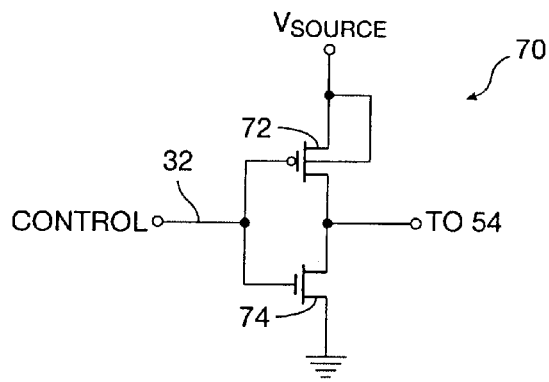
FIG. 3 is a circuit diagram of an inverter used in the present invention.

FIG. 3 shows one implementation of the inverter 70, which includes a PMOS transistor 72 and an NMOS transistor 74.

Figure 4:
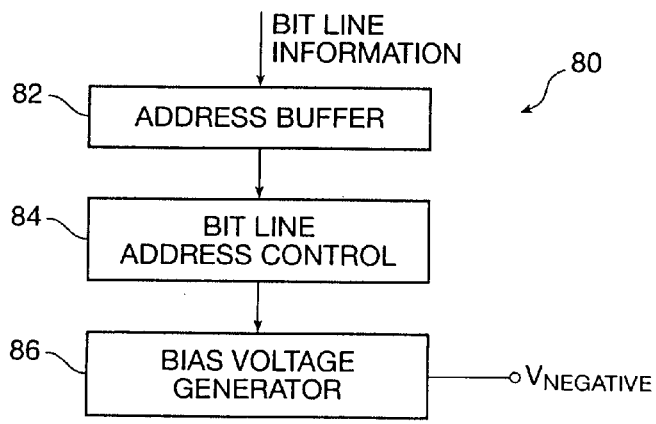
FIG. 4 is a block diagram of an address control circuit according to the present invention.

FIG. 4 shows a block diagram of an address control circuit 80. The address control circuit 80 includes an address buffer 82, a bit line address control circuit 84, and a bias voltage generator 86. The address control circuit 80 generates $V_{negative}$ and may be coupled to provide $V_{negative}$ to the source biasing circuit 50 (see FIG. 2).

The address buffer 82 stores data indicating a bit line 24 that is to be activated for reading or programming. Based on this data, the bit line address control circuit 84 determines the closeness of a metal line 34 to the bit line 24 to be activated. If the bit line 24 to be activated is close to a metal line 34, the bit line address control circuit 84 controls the bias voltage generator 86 to generate a small $V_{negative}$ (e.g., close to zero volts). If the bit line 24 to be activated is far from a metal line 34 (e.g., it has a worst-case maximum source line resistance of 0.4 volts as discussed above), the bit line address control circuit 84 controls the bias voltage generator 86 to generate a large $V_{negative}$ (e.g., close to −0.4 volts). If the bit line 24 to be activated is neither far from nor close to a metal line 34 (e.g., it has a moderate source line resistance such as 0.2 volts), the bit line address control circuit 84 controls the bias voltage generator 86 to generate a moderate $V_{negative}$ (e.g., between zero and −0.4 volts, such as −0.2 volts). In any case, the bit line address control circuit 84 controls the bias voltage generator 86 to generate a $V_{negative}$ sufficient to offset the source line resistance.

Although the above description has focused on specific embodiments, various modifications and their equivalents are considered to be within the scope of the present invention, which is to be limited only by the following claims.

What is claimed is:

1. An electrically-erasable, programmable read-only memory (EEPROM) circuit, comprising:
   a plurality of bit lines;
   a plurality of word lines;
   a source connection;
   a plurality of cell transistors coupling said plurality of bit lines, said plurality of word lines, and said source connection; and
   a source biasing circuit coupled to selectively provide a negative biasing voltage to said source connection, wherein said source biasing circuit comprises:
      a first set of two transistors coupled between an upper node supplying said source voltage and a lower node supplying said negative biasing voltage;
      a second set of two transistors coupled between said upper node and said lower node, wherein said second set is cross-coupled to said first set; and
      a third set of two transistors coupled between said upper node and said lower node, wherein said third set is controlled by said second set to selectively couple one of said source voltage and said negative biasing voltage to an output node.

2. The EEPROM of claim 1, wherein said source biasing circuit provides said negative biasing voltage to said source connection during at least one of a read operation and a programming operation.

3. The EEPROM of claim 1, further comprising:
   a plurality of metal lines coupling said source connection, wherein at least 17 bit lines separate each of said plurality of metal lines.

4. The EEPROM of claim 3, wherein 32 bit lines separate each of said plurality of metal lines.

5. The EEPROM of claim 3, wherein 64 bit lines separate each of said plurality of metal lines.

6. The EEPROM of claim 1, wherein said negative biasing voltage is between −0.5 and 0 volts.

7. The EEPROM of claim 1, wherein said negative biasing voltage is less than a junction built-in potential of said plurality of cell transistors.

8. An electrically-erasable, programmable read-only memory (EEPROM) circuit, comprising:
   a plurality of bit lines;
   a plurality of word lines;
   a source connection;
   a plurality of cell transistors coupling said plurality of bit lines, said plurality of word lines, and said source connection;
   a source biasing circuit coupled to selectively provide a negative biasing voltage to said source connection; and
   an address control circuit coupled to adjust said negative biasing voltage based on a comparison between a selected bit line and a metal line closest thereto.

9. The EEPROM of claim 8, further comprising:
   a plurality of metal lines coupling said source connection, wherein at least 17 bit lines separate each of said plurality of metal lines.

10. The EEPROM of claim 9, wherein 32 bit lines separate each of said plurality of metal lines.

11. The EEPROM of claim 9, wherein 64 bit lines separate each of said plurality of metal lines.

12. The EEPROM of claim 8, wherein said negative biasing voltage is between −0.5 and 0 volts.

13. The EEPROM of claim 8, wherein said negative biasing voltage is less than a junction built-in potential of said plurality of cell transistors.

14. The EEPROM of claim 8, wherein said source biasing circuit comprises:
- a first set of two transistors coupled between an upper node supplying said source voltage and a lower node supplying said negative biasing voltage;
- a second set of two transistors coupled between said upper node and said lower node, wherein said second set is cross-coupled to said first set; and
- a third set of two transistors coupled between said upper node and said lower node, wherein said third set is controlled by said second set to selectively couple one of said source voltage and said negative biasing voltage to an output node.

15. The EEPROM of claim 9, wherein said source biasing circuit provides said negative biasing voltage to said source connection during at least one of a read operation and a programming operation.

16. A method of improving at least one of a read performance and a programming performance of a plurality of cell transistors coupled to a plurality of bit lines in an electrically-erasable, programmable read-only memory (EEPROM) circuit, comprising the acts of:
- selectively providing a negative biasing voltage to a source connection of said plurality of cell transistors; and
- adjusting a level of said negative biasing voltage based on a comparison between a selected bit line and a metal line closest thereto in said EEPROM.

* * * * *

UNITED STATES PATENT AND TRADEMARK OFFICE
CERTIFICATE OF CORRECTION

PATENT NO. : 6,590,810 B2
DATED : July 8, 2003
INVENTOR(S) : Chang Wan Ha

It is certified that error appears in the above-identified patent and that said Letters Patent is hereby corrected as shown below:

<u>Title page,</u>
Item [73], Assignee, should read as follows:
-- [73] Assignee:  Winbond Electronics Corporation
 Taiwan, ROC --

Signed and Sealed this

Fourteenth Day of October, 2003

JAMES E. ROGAN
*Director of the United States Patent and Trademark Office*